United States Patent [19]

Sasaki et al.

[11] 4,275,093
[45] Jun. 23, 1981

[54] METHOD OF MANUFACTURING INSULATED GATE SEMICONDUCTOR DEVICES BY HIGH PRESSURE THERMAL OXIDATION WITH WATER VAPOR

[75] Inventors: Nobuo Sasaki; Yasuo Kobayashi, both of Kawasaki; Ryoiku Tohgei, Machida; Takashi Iwai, Kawasaki; Motoo Nakano, Yokohama, all of Japan

[73] Assignee: Fujitsu Limited, Japan

[21] Appl. No.: 48,069

[22] Filed: Jun. 13, 1979

[30] Foreign Application Priority Data

Jun. 14, 1978 [JP] Japan ................................ 53-71616

[51] Int. Cl.³ .................... H01L 21/316; H01L 29/78
[52] U.S. Cl. ...................................... 427/89; 148/1.5; 156/DIG. 64; 156/DIG. 103; 156/662; 357/23; 427/93; 427/255; 427/255.4; 427/94
[58] Field of Search ................ 427/93, 89, 255, 255.4, 427/94; 148/1.5; 357/23; 156/DIG. 64, DIG. 103, 662

[56] References Cited

U.S. PATENT DOCUMENTS 4,126,731 11/1978 Nishizawa et al. .................. 428/446

OTHER PUBLICATIONS

Capell et al., "Process refinements bring C-MOS on sapphire into commercial use," Electronics, vol 50, No. 11, May 26, 1977.
Powell et al., "Selective Oxidation of Silicon in Low-Temperature High Pressure Steam," IEEE Transactions on Electron Devices, vol. ED-21, No. 10, Oct. 1974.

Primary Examiner—John D. Smith
Attorney, Agent, or Firm—Staas and Halsey

[57] ABSTRACT

A method of manufacturing SOS type semiconductor devices having small leakage current comprising the steps of forming a single crystal semiconductor film on an insulator single crystal substrate, selectively forming a film for masking against oxidation on the surface of the single crystal semiconductor film, and thermally oxidizing the single crystal semiconductor film, in a region which is not covered with the masking film, down to the surface of the insulating single crystal substrate in a water vapor atmosphere having a high pressure which is at least more than atmospheric pressure.

10 Claims, 6 Drawing Figures

METHOD OF MANUFACTURING INSULATED GATE SEMICONDUCTOR DEVICES BY HIGH PRESSURE THERMAL OXIDATION WITH WATER VAPOR

BACKGROUND OF THE INVENTION

1. Field of the Invention

The present invention relates to a method of manufacturing semiconductor devices, and more particularly to an improvement of the so called SOS (Silicon on Sapphire) type semiconductor devices, in which active elements are formed in a single-crystal semiconductor film on an insulating single-crystal substrate.

2. Description of the Prior Art

An SOS type semiconductor device is manufactured by epitaxially forming a silicon single-crystal film on an insulating single-crystal substrate, such as sapphire and spinel, and by forming active elements in the silicon film. In the SOS type semiconductor device, parasitic capacitance (i.e. stray capacitance) can be sharply decreased, so that the operational speed of an integrated circuit of the SOS type semiconductor device is remarkably increased. Generally the silicon film on the insulating substrate is selectively etched to form the so called silicon islands to be used as active elements, which are insulated from each other. Then, the active elements are connected to each other with metal conductive lines. However, in this case there are steps formed between the surfaces of the silicon islands and the surface of the insulating substrate, and as a result, it is difficult to perform micro-circuit fabrication because the metal conductive lines sometimes break at the steps. Therefore, as a means of solving the above mentioned problem of breaking of metal lines, it has been already proposed to use a process involving the selective oxidation of silicon.

According to the above mentioned proposed process, a region between the active elements (i.e. a so-called field region) of the silicon film is etched, but the region of the silicon film is not completely etched, and the remaining silicon film is thermally oxidized to form a silicon dioxide film. As a result, islands of silicon are surrounded by the thusly formed silicon dioxide film and the surfaces of the silicon islands and silicon dioxide film are in the same plane. Such processes have been described in publications, for example, by Alan Capell et al, Process Refinements Bring C-Mos on Sapphire into Commercial Use, Electronics, May (1977) pages 99 to 105.

The SOS type semiconductor device has an advantage of a smaller parasitic capacitance than that of a non-SOS type semiconductor device. However, experiments conducted by the inventor of the present invention have proved that leakage current in the SOS type semiconductor device treated with the above-mentioned selective oxidation process is large. It is considered that this drawback is caused by:

(a) a misfit of the crystal lattices at the interface between the grown silicon film and the sapphire substrate, and (b) autodoping, i.e. the diffusion of aluminum from the substrate into the grown silicon.

SUMMARY OF THE INVENTION

Therefore, an object of the present invention is to reduce the leakage current in SOS type semiconductor devices.

Another object of the present invention is to provide a method of manufacturing SOS type semiconductor devices in which the leakage current is very small.

In accordance with the present invention, the foregoing and other objects are attained by a method of manufacturing an insulated gate type semiconductor device which comprises the steps of: forming a single crystal semiconductor film on an insulating single crystal substrate; selectively forming a film masking against oxidation on the surface of the single crystal semiconductor film, and thermally oxidizing a part of the semiconductor single crystal film in a region which is not masked with the film masking against oxidation, down to the surface of the insulating single crystal substrate, by arranging the insulating substrate in a water vapor atmosphere having a high pressure which is at least more than atmospheric pressure.

In order to carry out the thermal oxidizing step, it is preferable to use an apparatus which is known in the art for thermally oxidizing silicon in high-pressure steam, for example, the apparatus disclosed in U.S. Ser. No. 955,755.

It has been found that a remarkable reduction of the leakage current as compared with that of a conventional SOS type semiconductor device was attained when the thermal oxidizing step in the manufacturing method according to the present invention was carried out by applying a high-pressure oxidation process involving a low oxidation temperature.

The present invention will become more apparent from the detailed description and example which follow.

DETAILED DESCRIPTION OF THE PREFERRED EMBODIMENTS

Referring to FIGS. 1a through 1d, a manufacturing process of a semiconductor device, for example, an SOS type MIS (metal-insulator-semiconductor) device, will now be explained. On an insulating single crystal substrate 1 (e.g. a sapphire substrate), a semiconductor single crystal film 2 (e.g. a silicon layer) having one conductivity type (e.g. P-type) is epitaxially formed to produce a silicon on sapphire (SOS) wafer by an epitaxial growth technique known in the art. The epitaxial growth may be carried out by chemical vapor deposition as well as a well known molecular beam epitaxy method. The semiconductor film 2 is, first, covered with a silicon dioxide ($SiO_2$) film 3 and, then, with a film masking against oxidation 4 e.g. a silicon nitride ($Si_3N_4$) film.

Figure 1A:
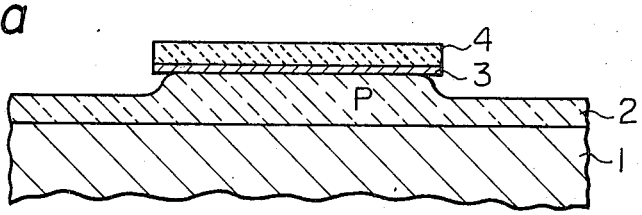
FIGS. 1a through 1d are schematic, cross-sectional views of an SOS type MIS (metal-insulator-semiconductor) device in various stages of its manufacture.

Next, the film masking against oxidation 4 and the silicon dioxide film 3 in a so called field region are removed and the semiconductor film 2 in the same field region is selectively etched to approximately half the original thickness of the semiconductor film by utilizing a conventional photolithography process (FIG. 1a). If the silicon nitride film 4, used as a mask against oxidation, directly covers the semiconductor (silicon) film 2, defects, e.g. strain are induced in the semiconductor film 2 and the semiconductor film 2 is sometimes contaminated. Accordingly, in order to prevent the strain and contamination from occuring, the silicon dioxide film 3 is preferably formed between the silicon nitride film 4 and the semiconductor film 2.

Next, the remaining semiconductor film 2 in the field region which is not covered with the film masking against oxidation 4 is converted to a silicon dioxide film 5 by a thermal oxidation treatment in accordance with the present invention. The thermal oxidation treatment is performed by heating the substrate 1 with the semiconductor film 2, silicon dioxide film 3 and film masking against oxidation 4 under a water vapor atmosphere having a higher pressure than atmospheric pressure, preferably from 3 to 15 kg/cm$^2$.

Figure 2:
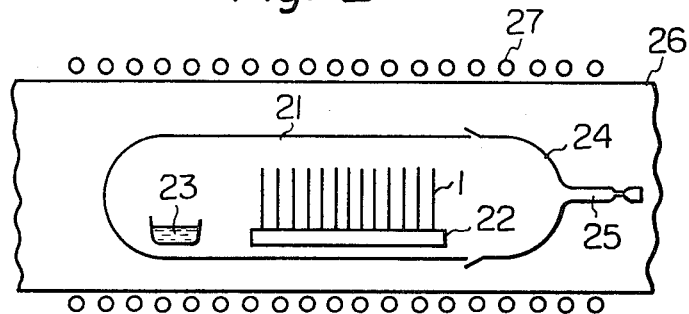
FIG. 2 is a schematic, cross-sectional view of a high-pressure oxidation apparatus which is used for the present invention.

Such high-pressure thermal oxidation treatment will now be explained in detail with reference to FIG. 2. A plurality of the substrates (wafers) 1, as shown in FIG. 1a, arranged on a wafer holder 22 and a predetermined amount of water 23 are inserted into a quartz capsule 21. The substrates are spaced apart from each other and stand on edge in parallel. Then, the quartz capsule 21 is covered with a quartz cap 24 provided with an exhaust pipe 25, and the capsule 21 and cap 24 are welded to form an airtight seal. The air within the capsule 21 is evacuated through the exhaust pipe 25 to attain a pressure of several Torr within the capsule 21. Thereafter, a part of the exhaust pipe 25 is fused by heating and, thus, the capsule 21 is completely sealed. Due to the evacuating operation, when the thermal oxidation treatment is performed, the oxidation atmosphere comprises a substantial amount of water vapor. As the pressure within the capsule 21 rapidly reduces, the water 23 placed in the capsule 21 boils and happens to splash on the wafers 1 and the wall of the capsule 21. However, such undesirable boiling and splashing can be prevented by freezing the water 23 before the evacuating operation. Next, the capsule 21 including the wafers 1 and water 23 is inserted into a heating furnace 26 and heated by applying electric current to a heater 27. The generated pressure in the capsule 21 depends on the volume of the capsule, the heating temperature and the amount of the enclosed water.

Figure 1B:
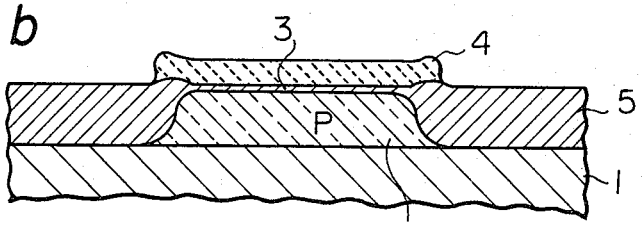
Figure 1C:
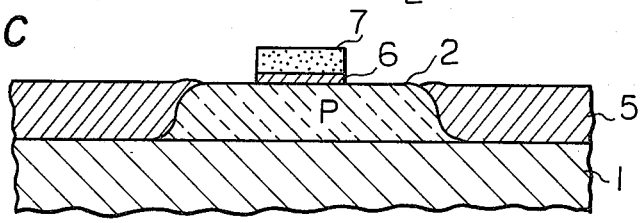

It is preferable to perform the thermal oxidation in the capsule at a pressure of from 3 to 15 kg/cm$^2$ and a temperature of from 700° to 1000° C. As a result of the thermal oxidation treatment, a part of the semiconductor (silicon) film 2 which is not masked with the film masking against oxidation 4 is completely oxidized down to the surface of the insulating substrate 1 to form the silicon dioxide film 5, as shown in FIG. 1b. The unoxidized parts of the silicon film are silicon islands 2 (in the case of FIGS. 1a through 1d one of the silicon islands is illustrated).

Figure 1D:
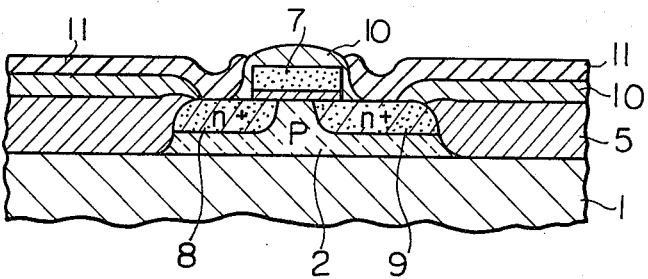

Each of the silicon islands 2 is changed into an active element, e.g. an MOS FET (metal-oxide-semiconductor field effect transistor), as shown in FIG. 1d, by a conventional technique. One of the conventional techniques is described in the above publication of Capell et al.

EXAMPLE

A single crystal sapphire wafer was used as an insulating substrate 1. A single crystal silicon film 2 was formed to approximately 6000 Å in thickness on the sapphire substrate by an epitaxial growth process. The silicon film 2 had P-type conductivity. On the surface of the silicon film 2, firstly, a silicon dioxide layer 3 500 Å thick and, then, a silicon nitride film 4 1500 Å thick were formed. Next, certain parts of the silicon nitride film 4 and silicon dioxide film 3 in a so called field region were etched by an ordinary etching technique. A part of the silicon film 2 in the field region was also etched to half its original thickness (i.e. approximately 3000 Å thick), as shown in FIG. 1a.

After the etching process the sapphire substrate 1 and water 23 were inserted into a quartz capsule 21. The amount of the inserted water was the quantity which was required to generate a water vapor pressure of 5 kg/cm$^2$ in the capsule 21 at a temperature of 900° C. The quartz capsule 21 was covered with a quartz cap 24 and the air in the capsule was evacuated until the pressure therein was 10$^{-3}$ Torr. After the capsule 21 was made to have an airtight seal the capsule 21 was inserted into a resistance heating furnace 26. After heating the capsule 21 at a temperature of 900° C. for a period of 180 minutes, the remaining silicon film 2 which was not covered with the silicon nitride film 4 was completely oxidized to the surface of the sapphire substrate 1, as shown in FIG. 1b. Thus, the formed silicon dioxide film 5 surrounded a silicon island 2.

Next, the silicon nitride film 4 and silicon dioxide film 3 on the silicon island 2 were removed by an ordinary etching process. After the etching process the silicon island 2 was thermally oxidized to form a gate oxide film 6 700 Å thick by an ordinary wet oxidation. A polycrystalline silicon film 7 was formed on the gate oxide film 6 by a chemical vapor deposition (CVD) process. Then, the polycrystalline silicon film 7 and gate oxide film 6 were selectively etched to form a gate pattern (FIG. 1c) by ordinary photolithography.

Arsenic ions were implanted at an energy of 150 keV with a dose of $5 \times 10^{15}$ cm$^{-2}$. After the ion implanation, an annealing treatment was performed at 1050° C. for 20 minutes. As a result, source and drain regions 8 and 9 were formed in the silicon island 2 and, simultaneously, the resistance of the gate electrode comprising polycrystal silicon film 7 was reduced. A phospho-silicate glass (PSG) film 10 was formed over the entire surface of the gate oxide film 6, the silicon island 2 and the silicon dioxide film 5 by a CVD process. Windows for the source and drain electrodes were opened in the PSG film 10 and, then an aluminum conductive film 11 was formed on the PSG film 10 and in the windows by an evaporation process. Then, the formed aluminum film 11 was selectively etched to form source and drain electrodes and metal conductive lines, and thus, an SOS type MOS FET was completed.

Figure 3:
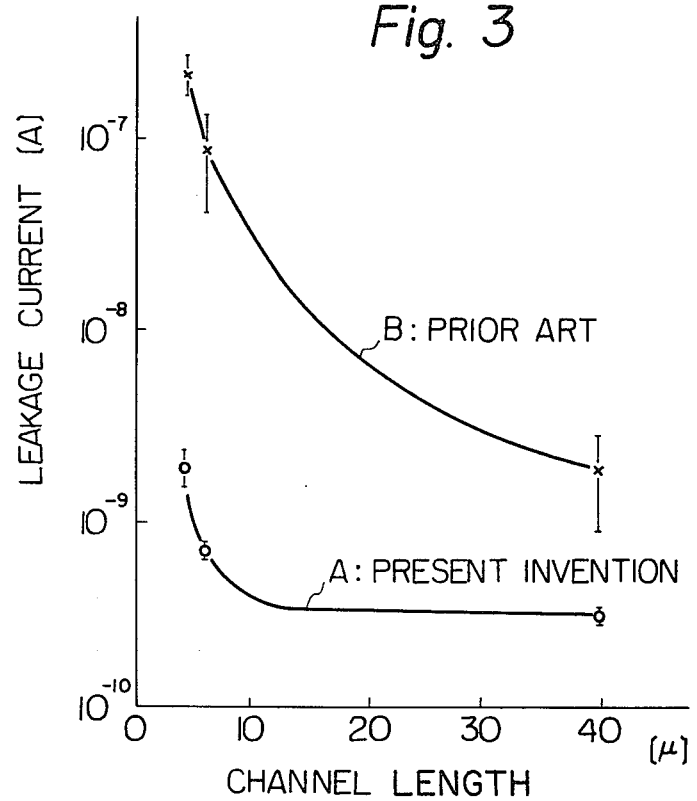
FIG. 3 is a diagram showing leakage current characteristics of the SOS type semiconductor devices according to the present invention and the prior art.

SOS type MOS field effect transistors having various channel lengths of 4, 6 and 40 μm were manufactured in the above-mentioned manner. These transistors were tested to measure the leakage current between the source and drain when a voltage of 5V was applied to the drain of each of the transistors and a voltage was not applied to the gate thereof. The obtained results are shown in FIG. 3 by the curve A. In FIG. 3, the abscissa is used to express channel length and the ordinate is used to express leakage current.

SOS type MOS field effect transistors were manufactured, as comparative examples, employing the same manufacturing conditions as the above-mentioned conditions except that the field oxide film 5 was formed by an ordinary wet oxidation, at atmospheric pressure, at 1050° C. for 200 minutes, instead of the high pressure oxidation. The transistors of the comparative examples were tested to measure the leakage current of each of the transistors, employing the same measuring conditions as the above-mentioned conditions. The obtained results are also known in FIG. 3, wherein the curve B has been drawn on the basis of the results.

As is evident from FIG. 3, the leakage current of the SOS type MOS field effect transistors manufactured in accordance with the method of the present invention is smaller than that of the comparative SOS type MOS field effect transistors. For example, in the case of a channel length of 40 μm, the leakage current of the MOS FET manufactured by the method of the invention is approximately one-tenth as much as that of the comparative MOS FET, and moreover, in the case of a channel length of approximately 5 μm, the leakage current of the MOS FET manufactured by the method of the invention is smaller by two orders of magnitude than that of the comparative MOS FET. Thus, a considerable reduction of the leakage current in an SOS type semiconductor device is attained by utilizing the manufacturing method of the present invention.

In the case of an MIS type IC (integrated circuit) device having capacitors and/or stray capacitors which store electric charges, the leakage current is reduced by utilizing the manufacturing method of the invention, so that, for example, in the case of a dynamic type random access memory (RAM), it is possible to maintain electric charges in capacitors of the RAM for a long period. Furthermore, in an SOS type bipolar semiconductor device, the method of the present invention is very useful because the leakage current between the emitter and collector induced by a parasitic MOS FET is reduced.

It will be obvious that the present invention is not restricted to the above-described embodiments and examples, and that many variations are possible for those skilled in the art without departing from the scope of the invention.

What we claim is:

1. A method of manufacturing an insulated gate type semiconductor device in an island of semiconductor material with a channel length of less than 40 microns and a low leakage current of less than $10^{-9}$ A at an applied source to drain potential of 5 volts and with an unbiased gate, said method comprising the steps of:

forming a single crystal semiconductor film on an insulating single crystal substrate;

selectively forming a film masking against oxidation on the surface of said single crystal semiconductor film, and thermally oxidizing a part of said single crystal semiconductor film, in a region which is not masked with said film masking against oxidation, down to the surface of said insulating single crystal substrate, to form said island by arranging said insulating substrate with said single crystal semiconductor film in a water vapor atmosphere having a pressure in the range from 3 to 15 $kg/cm^2$ and a temperature in the range from 700° C. to 1000° C., said oxidizing resulting in said device having said low leakage current;

forming source and drain regions of said device in said island to provide each channel length, forming the gate insulator or said device over said channel region, and forming gate, source and drain electrodes of said device.

2. A method according to claim 1 comprising etching a part of said single crystal semiconductor film in a region which is not covered with said film masking against oxidation to approximately half the original thickness of the single crystal semiconductor film before said oxidizing step.

3. A method according to claim 1 comprising selecting the material for said insulating single crystal substrate from the group consisting of sapphire and spinel.

4. A method according to claim 1 comprising forming said single crystal semiconductor film of silicon.

5. A method according to claim 3 comprising forming said single crystal semiconductor film by epitaxial growth.

6. A method according to claim 3 comprising forming said single crystal semiconductor film by molecular beam epitaxy.

7. A method according to claim 1 comprising forming said film masking against oxidation silicon to comprise nitride.

8. A method according to claim 5 comprising selectively forming a silicon dioxide film between said film masking against oxidation and said single crystal semiconductor film.

9. A method of manufacturing an insulated gate type semiconductor device having a maximum channel length of 6 microns and a maximum leakage current of less than $10^{-8}$ A at an applied source to drain potential of 5 volts and with an unbiased gate, said method comprising the steps of:

forming a single crystal semiconductor film on an insulating single crystal substrate;

selectively forming a film masking against oxidation on the surface of said single crystal semiconductor film, thermally oxidizing said single crystal semiconductor film in a region which is not masked with said film masking against oxidation, down to the surface of said insulating single crystal substrate, to form said island by arranging said insulating substrate with said single crystal semiconductor film in a water vapor atmosphere having a pressure in the range 3 to 15 $kg/cm^2$ at a temperature in the range from 700° to 1000° C., and forming said device with said source and drain regions and said gate to provide the device with said channel length and leakage current not larger than the respective maximum values.

10. The method of claim 9, comprising, forming said device to have said channel length of as short as 4 microns and said leakage current of less than $2 \times 10^{-9}$ A.

* * * * *

UNITED STATES PATENT AND TRADEMARK OFFICE
CERTIFICATE OF CORRECTION

PATENT NO. : 4,275,093
DATED : June 23, 1981
INVENTOR(S) : Nobuo Sasaki et al.

It is certified that error appears in the above—identified patent and that said Letters Patent is hereby corrected as shown below:

Front page, [73] Assignee, after "Limited," should read
--Fujitsu Limited, Kawasaki-shi, Kanagawa, Japan --.
Column 1, lines 12 and 26, "so called" should be --so-called--.
Column 2, line 17, after "film" insert --,--;
        line 45, ", and;" should be --; and--;
        line 62, "well known" should be --well-known--;
        line 68, "so called" should be --so-called--.
Column 4, line 11, "so called" should be --so-called--;
        line 15, "A" should be --$\overset{\circ}{A}$--;
        line 36, "700 A" should be --700 $\overset{\circ}{A}$--.
Column 6, line 8, "or" should be --of--.

Signed and Sealed this

First Day of December 1981

[SEAL]

Attest:

GERALD J. MOSSINGHOFF

Attesting Officer     Commissioner of Patents and Trademarks